US010026863B2

(12) United States Patent
Caris et al.

(10) Patent No.: US 10,026,863 B2
(45) Date of Patent: Jul. 17, 2018

(54) METHOD OF MANUFACTURING A SENSOR ARRAY

(71) Applicant: DPIX, LLC, Colorado Springs, CO (US)

(72) Inventors: Frank Caris, Colorado Springs, CO (US); Shawn Michael O'Rourke, Colorado Springs, CO (US); Byung-Kyu Park, Colorado Springs, CO (US); Terri Renae Pederson, Colorado Springs, CO (US)

(73) Assignee: DPIX, LLC, Colorado Springs, CO (US)

( * ) Notice: Subject to any disclaimer, the term of this patent is extended or adjusted under 35 U.S.C. 154(b) by 0 days.

(21) Appl. No.: 15/492,949

(22) Filed: Apr. 20, 2017

(65) Prior Publication Data
US 2018/0019367 A1    Jan. 18, 2018

Related U.S. Application Data

(60) Provisional application No. 62/361,882, filed on Jul. 13, 2016.

(51) Int. Cl.
H01L 33/00 (2010.01)
H01L 31/18 (2006.01)
H01L 27/144 (2006.01)
H01L 31/0232 (2014.01)
H01L 31/0392 (2006.01)

(52) U.S. Cl.
CPC ...... *H01L 31/1892* (2013.01); *H01L 27/1443* (2013.01); *H01L 27/1446* (2013.01); *H01L 31/02327* (2013.01); *H01L 31/03926* (2013.01)

(58) Field of Classification Search
CPC .... H01L 33/06; H01L 27/3244; H01L 27/326
See application file for complete search history.

(56) References Cited

U.S. PATENT DOCUMENTS

| 4,857,971 | A | * | 8/1989 | Burnham | B82Y 10/00 257/14 |
| 5,244,509 | A | * | 9/1993 | Arao | H01L 31/0236 136/246 |
| 6,831,409 | B2 | * | 12/2004 | Yamada | H01L 51/5265 313/112 |
| 7,067,849 | B2 | * | 6/2006 | Yoo | H01L 33/32 257/102 |
| 7,102,282 | B1 | * | 9/2006 | Yamada | H01L 27/322 313/504 |

(Continued)

Primary Examiner — Thao P Le
(74) Attorney, Agent, or Firm — Slater Matsil, LLP

(57) ABSTRACT

A method of manufacturing a sensor array includes providing a carrier glass substrate, forming an amorphous silicon layer over the carrier glass substrate, forming a first heat buffer layer over the amorphous silicon layer; forming a mirror layer over the first heat buffer layer; forming a second heat buffer layer over the mirror layer; forming a flexible substrate over the second heat buffer layer; and forming an active device layer over the flexible substrate. The method of the present invention further comprises exposing the sensor array to light from a flash lamp and then detaching the carrier glass substrate from the sensor array. The method of the present invention optionally further comprises filtering the light from the flash lamp to wavelengths below 350 nm.

20 Claims, 5 Drawing Sheets

(56) References Cited

U.S. PATENT DOCUMENTS

| | | | |
|---|---|---|---|
| 8,058,663 B2* | 11/2011 | Fan | H01L 27/15 |
| | | | 257/103 |
| 8,154,036 B2* | 4/2012 | Nakahara | H01L 33/32 |
| | | | 257/94 |
| 9,099,681 B2* | 8/2015 | Kijima | H01L 51/5275 |
| 9,620,677 B2* | 4/2017 | Yoo | H01L 33/0079 |

* cited by examiner

METHOD OF MANUFACTURING A SENSOR ARRAY

CROSS REFERENCE TO RELATED APPLICATION

The present application relates to and claims priority of U.S. provisional patent application ("Copending Provisional application") Ser. No. 62/361,882, filed on Jul. 13, 2016. The disclosure of the Copending Provisional Application is hereby incorporated by reference in its entirety.

FIELD OF THE INVENTION

The present invention is related to sensor arrays, and, more particularly, to a manufacturing method associated with a sensor array having a flexible substrate.

BACKGROUND OF THE INVENTION

Sensor arrays are known in the art, including sensor array embodiments having a flexible substrate. Typically, a carrier substrate is used in the manufacturing process and must be separated from the sensor array before the manufacturing process is completed. While methods of detaching the carrier substrate are known, these methods can damage the sensor array resulting in higher manufacturing costs or lower quality sensor arrays. What is desired is a method of manufacturing a flexible substrate sensor array wherein the sensor array is not damaged when the carrier substrate is removed during the manufacturing process.

SUMMARY OF THE INVENTION

According to the present invention a method of manufacturing a sensor array comprises providing a carrier glass substrate; forming an amorphous silicon layer over the carrier glass substrate; forming a first heat buffer layer over the amorphous silicon layer; forming a mirror layer over the first heat buffer layer; forming a second heat buffer layer over the mirror layer; forming a flexible substrate over the second heat buffer layer; and forming an active device layer over the flexible substrate. The method of the present invention further comprises exposing the sensor array to light from a flash lamp and then detaching the carrier glass substrate from the flexible substrate of the sensor array. The method of the present invention optionally further comprises filtering the light from the flash lamp to wavelengths below 350 nm.

The carrier glass substrate can comprise a detachable carrier glass substrate; the amorphous silicon layer can comprise a hydrogenated amorphous silicon layer; the first heat buffer layer can comprise a transparent layer; the transparent layer can comprise a layer of SiOx, ITO, or transparent metal oxide film; the mirror layer can comprise a reflective metal layer; the second heat buffer layer comprises a transparent layer; the transparent layer comprises a layer of SiOx, ITO, or IGZO; and the active layer can comprise a plurality of TFT devices and corresponding photodiodes.

It is an advantage of the present invention that it provides a less expensive manufacturing method of detaching flexible sensor array films off carrier glass substrates and provides a higher quality flexible sensor array. Expensive excimer laser need not be used in the method of the present invention and a less expensive flash lamp can be substituted. It is a further advantage of the method of the present invention that the equipment needed to carry out the method does not take as much area in the clean room manufacturing area when compared with previous methods.

The foregoing and other features, utilities and advantages of the invention will be apparent from the following more particular description of an embodiment of the invention as illustrated in the accompanying drawings.

DETAILED DESCRIPTION

According to the present invention a flash lamp is used for rapidly heating up an a-Si:H thin film to detach the flexible layer from the rigid glass substrate at the end of flat panel manufacturing process by adding a reflective metal layer and at least one heat buffer layer to protect the active layers of the array from being damaged by the flash lamp heating.

Figure 1A:
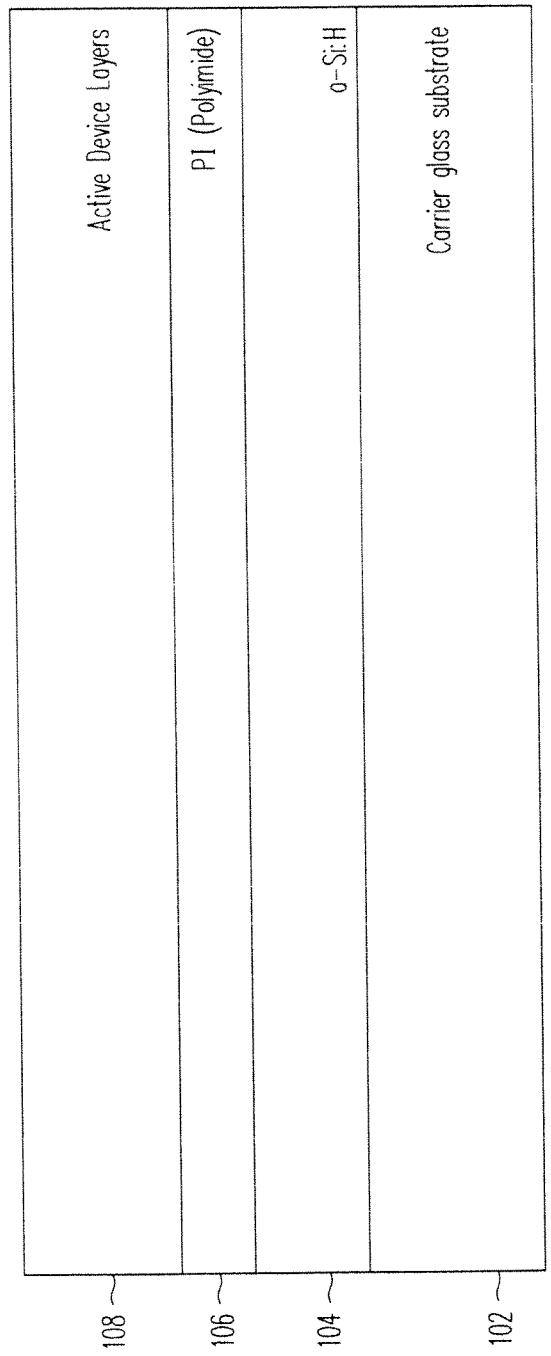
FIG. 1A is a cross sectional diagram of a flexible sensor array on a carrier glass substrate according to a first embodiment of the invention.
Figure 1B:
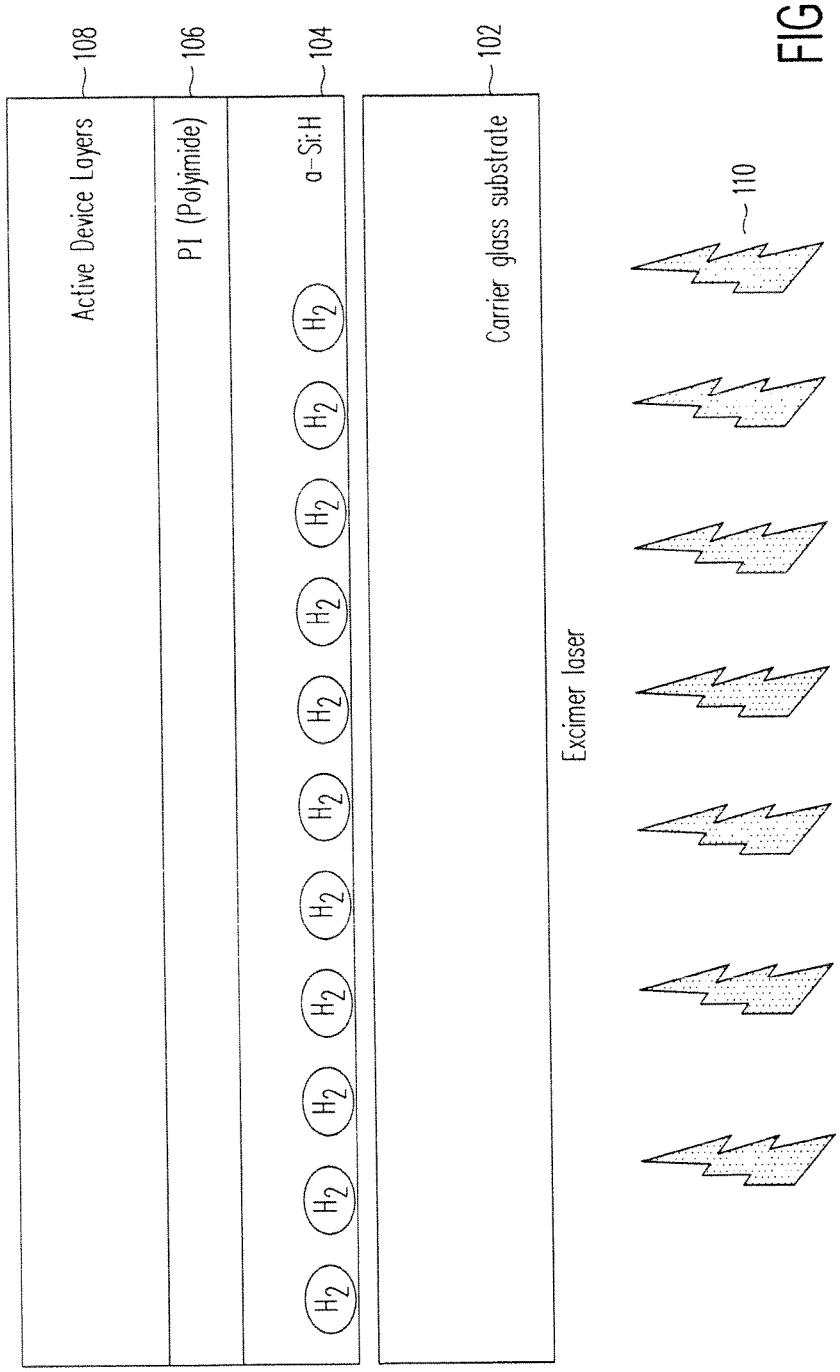
FIG. 1B is a cross sectional diagram of a flexible sensor array detached from the carrier glass substrate according a first embodiment of the invention.

At the end of the flexible flat panel manufacturing process, an excimer laser (of short wavelength) is used at the backside of the carrier glass to detach the flexible substrate (as shown in FIG. 1A and FIG. 1B, which are described in further detail below.

Referring now to FIG. 1A, a sensor array is shown including a carrier glass substrate 102, a hydrogenated amorphous silicon (a-Si:H) layer 102, a PI (Polyimide) layer 106, and active layer 108, including thin-film transistor (TFT) and photodiode components. In FIG. 1A, the carrier glass substrate 102 is still attached to the amorphous silicon layer 104.

Referring now to FIG. 1B, the same layers are shown, except that carrier glass substrate 102 is shown to be detached from the amorphous silicon layer 104 after exposure to light 110 from an excimer laser.

The laser anneals only the a-Si:H layer 104 and no other layers above it. The hydrogen ($H_2$ shown is layer 104) evaporates out from the a-Si:H layer 104, causing the film stack (104, 106, 108) to delaminate/detach from the carrier glass 102. An excimer laser tool is typically expensive and requires complex optics and a large housing area in the clean room used for manufacturing the sensor array.

If a flash lamp is used instead of an excimer laser to anneal the a-Si:H layer, the light will not only heat up the a-Si:H layer but also the layers above it including the active device layers. This heating caused by the broad band of light spectrum from the flash lamp can change or even damage the properties of the active layers.

But if a mirror layer is added between the a-Si:H layer and the flexible PI layer, the mirror can reflect most of light from the flash lamp, thereby protecting the layers above it from the heat. The reflected light from the mirror will also further heat the a-Si:H layer. The mirror layer can be any metal with high temperature melting point, desirably with high reflectivity. It can be surrounded by low hydrogen content layers that can be deposited in any flat panel manufacturing line (such as PECVD SiOX film) seen in FIG. 2A and FIG. 2B, described in further detail below.

Figure 2A:
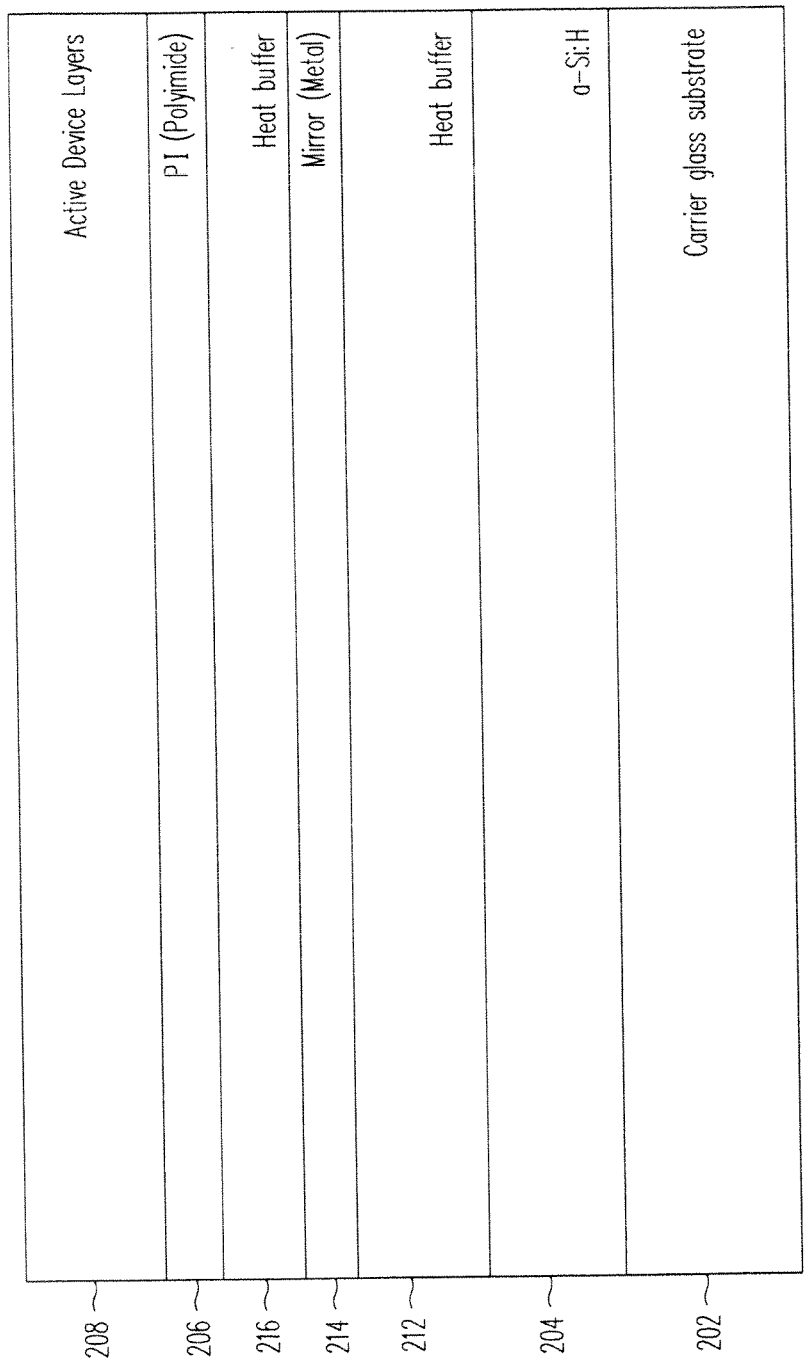
FIG. 2A is a cross sectional diagram of a flexible sensor array on a carrier glass substrate according to a second embodiment of the invention.
Figure 2B:
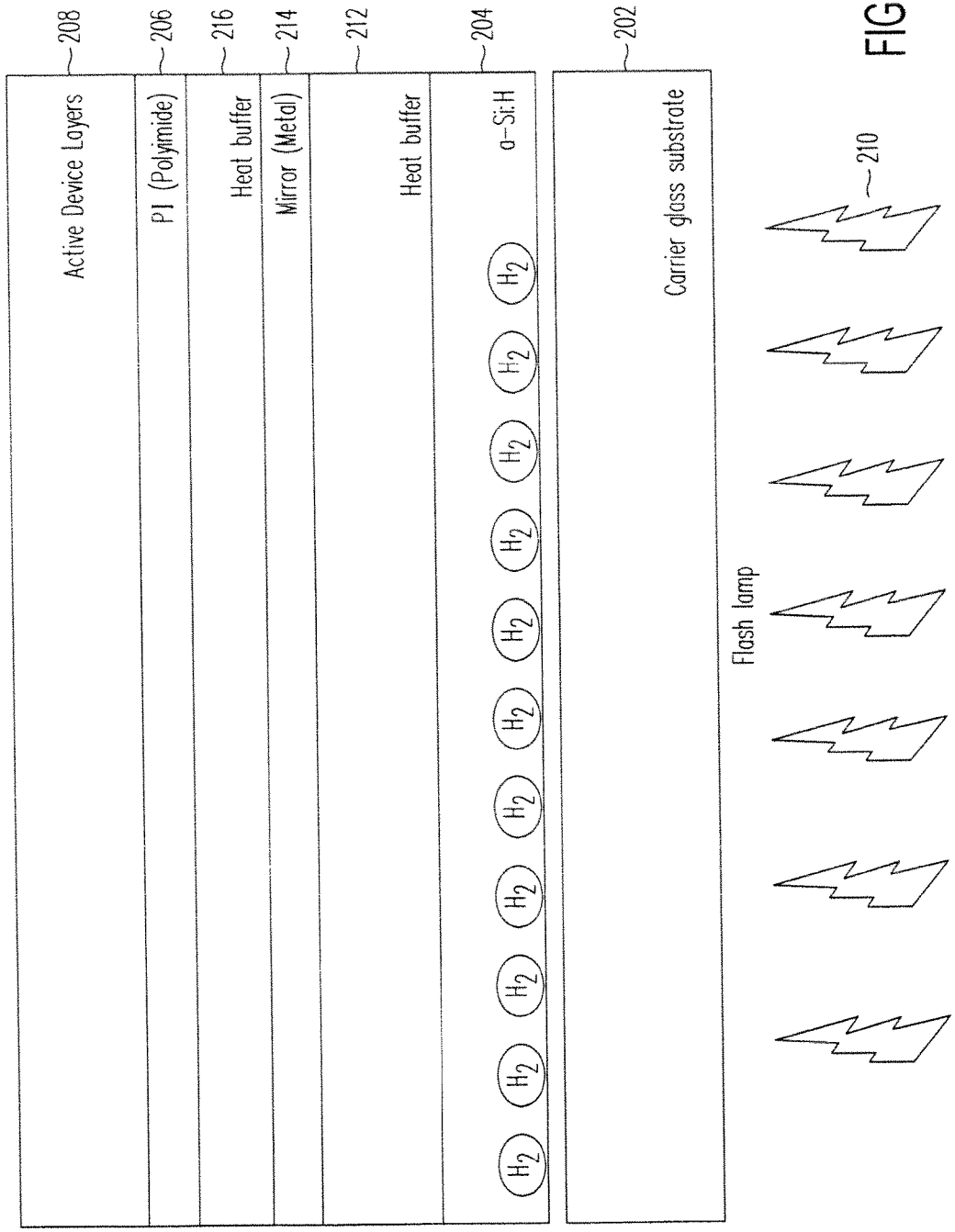
FIG. 2B is a cross sectional diagram of a flexible sensor array detached from the carrier glass substrate according a second embodiment of the invention.

Referring now to FIG. 2A, a sensor array is shown including a carrier glass substrate 202, a hydrogenated amorphous silicon (a-Si:H) layer 204, a first heat buffer layer 212, a mirror layer 214, a second heat buffer layer 216, a PI (Polyimide) layer 206, and an active layer 208, including thin-film transistor (TFT) and photodiode components. In FIG. 2A, the carrier glass substrate 202 is still attached to the amorphous silicon layer 204.

Referring now to FIG. 1B, the same layers are shown, except that carrier glass substrate 202 is shown to be detached from the amorphous silicon layer 204 after exposure to light 210 from the flash lamp.

According to the present invention, a flash lamp tool can be very cost-effective compared to an excimer laser tool with comparable light output. Also, the flash lamp can be made in a smaller footprint, saving valuable clean room area.

Figure 3:
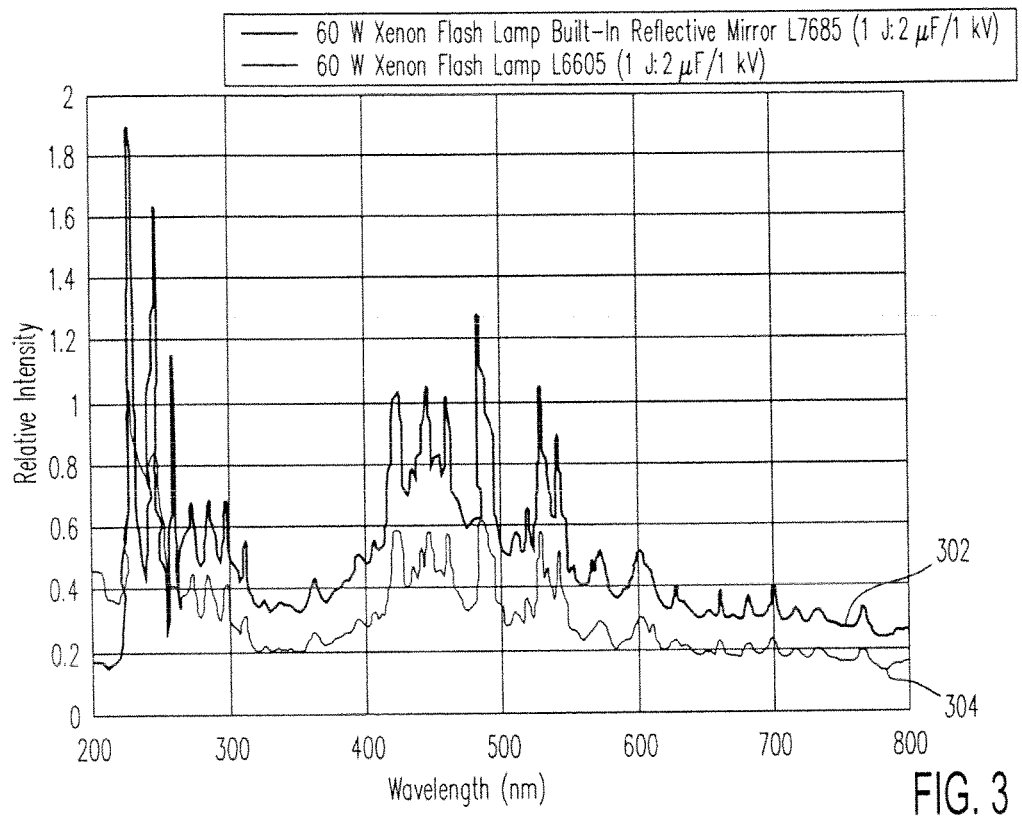
FIG. 3 is a graph of a representative spectral output of a flash lamp for use in the method of the present invention.
Figure 4:
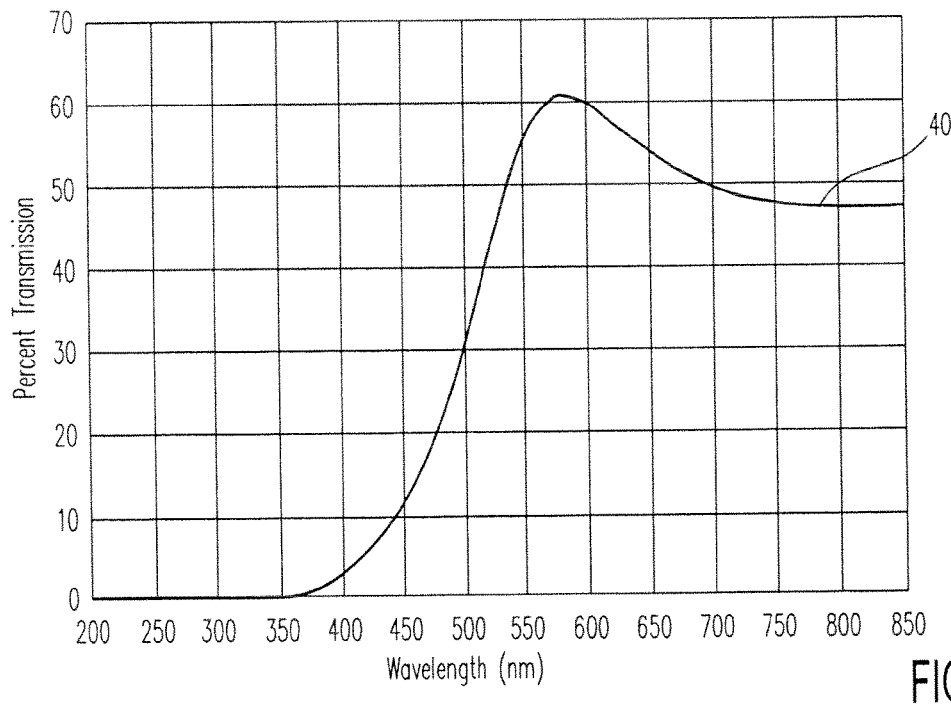
FIG. 4 is a graph of an example transmission of an amorphous silicon thin film for use in the method of the present invention.

FIGS. 3 and 4 show representative examples of flash lamp spectral output (302, 304 in FIG. 3) and a-Si transmission (402 in FIG. 4) respectively. As seen by comparing the FIGS. 3 and 4, there is relatively high absorption of light in the visible region and near 100% absorption in the UV (<350 nm) where the flash lamp has the highest relative intensity.

The heat buffer layer PECVD SiOX can be replaced by any other low hydrogen content transparent film. The purpose of this layer is to protect the mirror and the active layers from the heat from the a-Si:H layer. Any PECVD film has some amount of hydrogen in it, which tends to evaporate out rapidly when heated, damaging the surrounding films. It can also be replaced by transparent metals oxides (such as ITO or IGZO) that can be deposited by PVD. It is known in the art that ITO refers to Indium Tin Oxide, and IGZO refers to Indium, Gallium, Zinc and Oxide.

Alternatively, according to the present invention, an optical filter (not shown) can be employed to narrow the range of wavelengths transmitted to the fugitive amorphous silicon thin film. An example according to the present invention would be a filter to block all visible light and allow UV wavelengths (<350 nm) to pass. Furthermore, a filter set would allow greater flexibility in fine tuning the peak wavelength and fluence of the flash lamp. In particular, this would prove valuable as the lamp ages or after one is replaced.

In summary, at the end of flexible substrate processing for a sensor array, the flexible substrate, commonly PI (Polyimide), has to be detached from the carrier glass substrate. A process technique called LLO (Laser Lift Off) is used to separate PI from the carrier glass substrate. In LLO process, short wavelength of laser illuminated from the backside of glass. The laser anneals only the sacrificial a-Si:H (hydrogenated Amorphous Silicon) layer, causing it to release the hydrogen atoms in the silicon layer. The rapid evaporation of hydrogen from the a-Si:H layer causes damage to the film and thus the flexible layer, PI, gets detached from the carrier glass substrate. This is an expensive process step in the manufacturing flow. Flash lamp annealing can be used to evaporate out the hydrogen from the a-Si:H layer as well. But the wavelength from a flash lamp comes in a wide spectrum—from infrared to ultraviolet. Therefore, the light from the flash lamp does not only anneal the a-Si:H layer but also heat up all other active layers causing substantial damage to the electrical and mechanical properties. Adding a mirror after the a-Si:H can block the light and protect the active layers from the flash lamp, heating up only the sacrificial a-Si:H layer for detaching the flexible layer off the carrier glass substrate.

While the invention has been particularly shown and described with reference to a preferred embodiment thereof, it will be understood by those skilled in the art that various other changes in the form and details may be made without departing from the spirit and scope of the invention.

The invention claimed is:

1. A sensor array comprising:
a carrier glass substrate;
an amorphous silicon layer over the carrier glass substrate;
a first heat buffer layer over the amorphous silicon layer;
a mirror layer over the first heat buffer layer;
a second heat buffer layer over the mirror layer;
a flexible substrate over the second heat buffer layer; and
an active device layer over the flexible substrate.

2. The sensor array of claim 1, wherein the carrier glass substrate comprises a detachable carrier glass substrate.

3. The sensor array of claim 1, wherein the amorphous silicon layer comprises a hydrogenated amorphous silicon layer.

4. The sensor array of claim 1, wherein the first heat buffer layer comprises a transparent layer.

5. The sensor array of claim 4, wherein the transparent layer comprises a layer of SiOx, ITO, or IGZO.

6. The sensor array of claim 1, wherein the mirror layer comprises a reflective metal layer.

7. The sensor array of claim 1, wherein the second heat buffer layer comprises a transparent layer.

8. The sensor array of claim 7, wherein the transparent layer comprises a layer of SiOx, ITO, or IGZO.

9. The sensor array of claim 1, wherein the active layer comprises a plurality of TFT devices.

10. The sensor array of claim 1, wherein the active layer comprises a plurality of photodiodes.

11. A method of manufacturing a sensor array comprising:
providing a carrier glass substrate;
forming an amorphous silicon layer over the carrier glass substrate;
forming a first heat buffer layer over the amorphous silicon layer;
forming a mirror layer over the first heat buffer layer;
forming a second heat buffer layer over the mirror layer;
forming a flexible substrate over the second heat buffer layer; and
forming an active device layer over the flexible substrate.

12. The sensor array of claim 1, further comprising exposing the sensor array to light from a flash lamp.

13. The sensor array of claim 12, further comprising filtering the light from the flash lamp to wavelengths below 350 nm.

14. The sensor array of claim 12, further comprising detaching the carrier glass substrate from the sensor array.

15. The sensor array of claim 11, wherein providing the carrier glass substrate comprises providing a detachable carrier glass substrate.

16. The sensor array of claim 11, wherein forming the amorphous silicon layer comprises forming a hydrogenated amorphous silicon layer.

17. The sensor array of claim 11, wherein forming the first heat buffer layer comprises forming a transparent layer.

18. The sensor array of claim 1, wherein forming the mirror layer comprises a forming reflective metal layer.

19. The sensor array of claim 1, wherein forming the second heat buffer layer comprises forming a transparent layer.

20. The sensor array of claim 1, wherein forming the active layer comprises forming a plurality of TFT devices and a plurality of photodiodes.

* * * * *